United States Patent
Jia et al.

(10) Patent No.: US 10,691,098 B2
(45) Date of Patent: Jun. 23, 2020

(54) METHOD OF ACCURATELY PREDICTING ENERGY CONSUMPTION OF AUTOMATIC TOOL CHANGE FOR MULTI-POSITION ROTARY TOOL HOLDER OF NUMERICAL CONTROL MACHINE

(71) Applicant: SHANDONG UNIVERSITY OF SCIENCE AND TECHNOLOGY, Qingdao (CN)

(72) Inventors: Shun Jia, Qingdao (CN); Qinghe Yuan, Qingdao (CN)

(73) Assignee: SHANDONG UNIVERSITY OF SCIENCE AND TECHNOLOGY, Qingdao (CN)

( * ) Notice: Subject to any disclaimer, the term of this patent is extended or adjusted under 35 U.S.C. 154(b) by 0 days.

(21) Appl. No.: 16/483,995

(22) PCT Filed: May 29, 2018

(86) PCT No.: PCT/CN2018/088876
§ 371 (c)(1),
(2) Date: Aug. 6, 2019

(87) PCT Pub. No.: WO2019/136906
PCT Pub. Date: Jul. 18, 2019

(65) Prior Publication Data
US 2020/0019135 A1    Jan. 16, 2020

(30) Foreign Application Priority Data
Jan. 11, 2018   (CN) .......................... 2018 1 0024999

(51) Int. Cl.
*G05B 19/19*      (2006.01)
*G05B 19/4063*   (2006.01)
(Continued)

(52) U.S. Cl.
CPC ......... *G05B 19/19* (2013.01); *G05B 19/4063* (2013.01); *G05B 23/0224* (2013.01); *B23Q 3/15503* (2016.11); *G06F 30/00* (2020.01)

(58) Field of Classification Search
None
See application file for complete search history.

(56) References Cited

PUBLICATIONS

Balogun Vincent Aizebeoje et al., "Modeling of Direct Energy Requirements in Mechanical Machining Processes", Oct. 22, 2012, Journal of Cleaner Production 41, Elsevier Ltd. (Year: 2012).*

(Continued)

*Primary Examiner* — Cedric Johnson
(74) *Attorney, Agent, or Firm* — Hauptman Ham, LLP

(57) ABSTRACT

A method of accurately predicting energy consumption of an automatic tool change process is described. Automatic tool change durations at a plurality of groups of rotary tool position numbers are measured and a calculation model of the automatic tool change duration is obtained. A basic module power of machine is obtained. A basic module energy consumption of machine is obtained by calculation based on the basic module power of machine and the automatic tool change duration. A steady state power of tool changer is obtained. A steady state energy consumption of tool changer is calculated. A transient state energy consumption of tool changer is obtained by accumulating energy consumptions. An energy consumption prediction model of the automatic tool change process is obtained using the obtained basic module energy consumption of machine, the obtained steady state energy consumption of tool changer, and the obtained transient state energy consumption of tool changer.

2 Claims, 3 Drawing Sheets

(51) Int. Cl.
G05B 23/02 (2006.01)
B23Q 3/155 (2006.01)
G06F 30/00 (2020.01)

(56) References Cited

PUBLICATIONS

Bi, Z.M. et al., "Optimization of Machining Processes from the Perspective of Energy Consumption: A Case Study", Jul. 28, 2012, Journal of Manufacturing Systems 31, Elsevier Ltd. (Year: 2012).*
Jia, Shun et al., "Accurate Prediction Method for Energy Consumption in Automatic Tool Changing Process of Computer Numerical Control Lathe", 2019, 2nd World Conference on Mechanical Engineering and INtelligent Manufacturing (WCMEIM), IEEE. (Year: 2019).*
International search report dated Jul. 23, 2018 from corresponding application No. PCT/CN2018/088876.
Written Opinion dated Aug. 7, 2018 from corresponding application No. PCT/CN2018/088876.
The First search report dated Feb. 27, 2019 from corresponding application No. 201810024999.1.

* cited by examiner

METHOD OF ACCURATELY PREDICTING ENERGY CONSUMPTION OF AUTOMATIC TOOL CHANGE FOR MULTI-POSITION ROTARY TOOL HOLDER OF NUMERICAL CONTROL MACHINE

RELATED APPLICATIONS

The present application is a National Phase of International Application Number PCT/CN2018/088876, filed May 29, 2018, and claims the priority of China Application No. 201810024999.1, filed Jan. 11, 2018.

TECHNICAL FIELD

The present disclosure relates to energy consumption prediction of an automatic tool change of a numerical control machine and in particular to a method of accurately predicting energy consumption of an automatic tool change process of a multi-position rotary tool holder of a numerical control machine.

BACKGROUND

A numerical control machine needs to perform several automatic tool changes among tools such as an external turning tool, an inner hole turning tool, a grooving cutter and a thread cutter due to different processing features such as a cylindrical surface, a thread and a cutting groove during a machining process. Since the tool change process consumes energy and happens frequently, energy consumption of an automatic tool change of a multi-position rotary tool holder of a numerical control machine becomes an important part of the energy consumption of the machining process of the numerical control machine. It is significant to establish an energy consumption prediction model of an automatic tool change of a numerical control machine to improve an energy consumption prediction accuracy of an entire machining process of the numerical control machine and optimize the energy consumption of the numerical control machine.

Because several power peaks may be generated in the automatic tool change process of the multi-position rotary tool holder of the numerical control machine, the energy consumption of the entire tool change process includes both energy consumption caused by power stabilization and energy consumption caused by the power peak. At present, there is still a need to seek an effective method of accurately predicting the entire process energy consumption of the multi-position rotary tool holder of the numerical control machine and comprehensively consider energy consumptions of steady state and transient state. The method according to the present disclosure further establishes an energy consumption prediction model of an entire automatic tool change process by establishing calculation models of basic module energy consumption of machine, a steady state energy consumption of tool changer and a transient state energy consumption of tool changer in an automatic tool change process of the multi-position rotary tool holder of the numerical control machine. This method of the present disclosure considers the transient state energy consumption as well as steady state energy consumption in the automatic tool change process of the numerical control machine, which is in better compliance with the actual situations, leading to an accurate energy consumption prediction. Thus, the method is a practical method of accurately predicting energy consumption of an automatic tool change process of the multi-position rotary tool holder of the numerical control machine.

SUMMARY

The object of the present disclosure is to provide a method of accurately predicting energy consumption of an automatic tool change process under different rotary tool position numbers before the automatic tool change of a numerical control machine. This method provides a high accuracy of prediction and therefore important model and method supports are provided for accurate prediction and optimization of energy consumption of a machining process of the numerical control machine.

The method of accurately predicting energy consumption of the automatic tool change process of the multi-position rotary tool holder of the numerical control machine includes the following steps.

At step 1, a rotary tool position number is determined according to a current tool position number and a target tool position number of the multi-position rotary tool holder of the numerical control machine. Since a unidirectional sequential rotation manner is usually adopted for the multi-position rotary tool holder of the numerical control machine, a formula of calculating the rotary tool position number may be expressed as:

$$\Delta = \begin{cases} T_t - T_i, & T_t \geq T_i \\ T_p - |T_t - T_i|, & T_t < T_i \end{cases}$$

where $\Delta$ refers to a rotary tool position number of rotary tool holder, $T_t$ refers to a target tool position number of the rotary tool holder, $T_i$ refers to a current tool position number of the rotary tool holder and $T^p$ refers to a total tool position number of the rotary tool holder.

At step 2, an automatic tool change duration value ($t_{tc1}$, $t_{tc2}$, ... $t_{tcN}$) at different rotary tool position numbers ($\Delta_1$, $\Delta_2$, ... $\Delta_N$) of the numerical control machine is obtained by measurement, where $\Delta_N$ refers to the N-th rotary tool position number and $t_{tcN}$ refers to an automatic tool change duration value at the N-th rotary tool position number.

At step 3, data fitting is performed with the rotary tool position number $\Delta$ as an independent variable and the automatic tool change duration value $t_{tc}$ as a response variable according to the obtained automatic tool change durations obtained at a plurality of groups of rotary tool position numbers so that a calculation model of the automatic tool change duration is established. The model is expressed as:

$$t_{tc} = \frac{\alpha \Delta}{1 + \beta \Delta}$$

where $t^{tc}$ refers to a automatic tool change duration, $\Delta$ refers to a rotary tool position number of rotary tool holder, and $\alpha$ and $\beta$ refer to coefficients of the formula.

At step 4, the basic module power of machine is obtained by collecting a plurality of basic module powers of machine and obtaining an average value. The power is calculated according to the following formula:

$$P_{basic} = \sum_{i=1}^{N_b} P_{basic\_i} / N_b$$

where $P_{basic}$ refers to a basic module power of machine, $P_{basic\_i}$ refers to the i-th measured value of the basic module power of machine and $N_b$ refers to a total number of the measured values of the basic module power of machine.

At step 5, the basic module energy consumption of machine in the automatic tool change process of the numerical control machine is obtained by calculation according to the obtained basic module power of machine and the obtained automatic tool change duration. The calculation is performed based on the following formula:

$$E_{basic} = P_{basic} \times t_{tc}$$

where $E_{basic}$ refers to a basic module energy consumption of machine in the automatic tool change of the numerical control machine, $P_{basic}$ refers to a basic module power of machine and $t_{tc}$ refers to an automatic tool change duration.

At step 6, a steady state power of tool changer in the automatic tool change process of the numerical control machine by collecting a plurality of steady state powers of tool changer and obtaining an average value. The calculation is performed based on the following formula:

$$P_{ms} = \sum_{j=1}^{N_{s\Delta}} P_{ms,\Delta\_j} / N_{s\Delta}$$

where $P_{ms}$ refers to the steady state power of tool changer, $P_{ms,\Delta\_j}$ refers to the j-th measured value of the steady state power of tool changer when the rotary tool position number of rotary tool holder is $\Delta$, and $N^{s\Delta}$ refers to the total number of the measured values of the steady state power of tool changer when the rotary tool position number of rotary tool holder is $\Delta$.

At step 7, the steady state module energy consumption of tool changer in the automatic tool change process of the numerical control machine is obtained by calculation according to the obtained steady power of tool changer and the obtained automatic tool change duration. The calculation is performed according to the following formula:

$$E_{ms} = P_{ms} \times t_{tc}$$

where $E_{ms}$ refers to the steady state energy consumption of tool changer in the automatic tool change process of the numerical control machine, ms refers to the steady state power of tool changer, and $t_{tc}$ refers to the automatic tool change duration.

At step 8, the transient state energy consumption of tool changer is obtained by accumulating energy consumptions caused by all power peaks in the automatic tool change process of the numerical control machine. The calculation is performed based on the following formula:

$$E_{mt} = \sum_{u=1}^{N_\Delta} E_{mt,\Delta\_u}$$

where $E_{mt}$ refers to the transient state energy consumption of tool changer in the automatic tool change process of the numerical control machine, $\Delta$ refers to the rotary tool position number of rotary tool holder, $E_{mt,\Delta\_u}$ refers to an energy consumption caused by the u-th power peak when the rotary tool position number of rotary tool holder is $\Delta$, and $N_\Delta$ refers to a total number of power peaks when the rotary tool position number of rotary tool holder is $\Delta$.

At step 9, an energy consumption of the automatic tool change process is obtained by calculation according to the obtained basic module energy consumption of machine, the obtained steady state energy consumption of tool changer, and the obtained transient state energy consumption of tool changer in the automatic tool change process of the numerical control machine. The calculation is performed based on the following formula:

$$E_{tc} = E_{basic} + E_{ms} + E_{mt}$$

where $E_{tc}$ refers to the energy consumption of the automatic tool change process of the multi-position rotary tool holder of the numerical control machine, $E_{basic}$ refers to the basic module energy consumption of machine of the automatic tool process of the numerical control machine, $E_{ms}$ refers to the steady state energy consumption of tool changer in the automatic tool change process of the numerical control machine, and $E_{mt}$ refers to the transient state energy consumption of tool changer in the automatic tool change process of the numerical control machine.

Data fitting is performed by a function "Modified Hyperbola I" in a data analysis software at step 3.

At step 6, the j-th measured value of the steady state power of tool changer when the rotary tool position number of the rotary tool holder is $\Delta$ is collected as follows: the j-th steady state power of machine $P_{ms,\Delta\_j}$ in the automatic tool change process when the rotary tool position number is $\Delta$ is collected and a main shaft rotational power at the rotation speed is obtained by further subtracting the basic module power of machine $P_{basic}$, and the main shaft rotational power is expressed as: $P_{ms,\Delta\_j} = P_{mst,\Delta\_j} - P_{basic}$.

Compared with the prior art, the present disclosure has the following benefits.

The method according to the present disclosure further obtains the basic module energy consumption of machine, the steady state energy consumption of tool changer, and the transient state energy consumption of tool changer in the automatic tool change process of the numerical control machine by establishing the calculation model of the automatic tool change duration of the numerical control machine. The above three energy consumptions jointly constitute the energy consumption prediction model of the automatic tool change process of the numerical control machine. This method of the present disclosure considers the transient state energy consumption as well as the steady state energy consumption in the automatic tool change process of the numerical control machine, which is in better compliance with the actual situations, leading to an accurate energy consumption prediction. Thus, an important model support is provided for establishing an accurate energy consumption prediction model of the entire machining process of the numerical control machine.

This method provides a high accuracy of energy consumption prediction for the automatic tool change process of the multi-position rotary tool holder of the numerical control machine and may be conveniently applied to energy consumption predictions of automatic tool change processes of other machines such as a numerical control machining center.

DETAILED DESCRIPTION OF THE EMBODIMENTS

The present disclosure will be detailed below in combination with examples and drawings.

Figure 1:
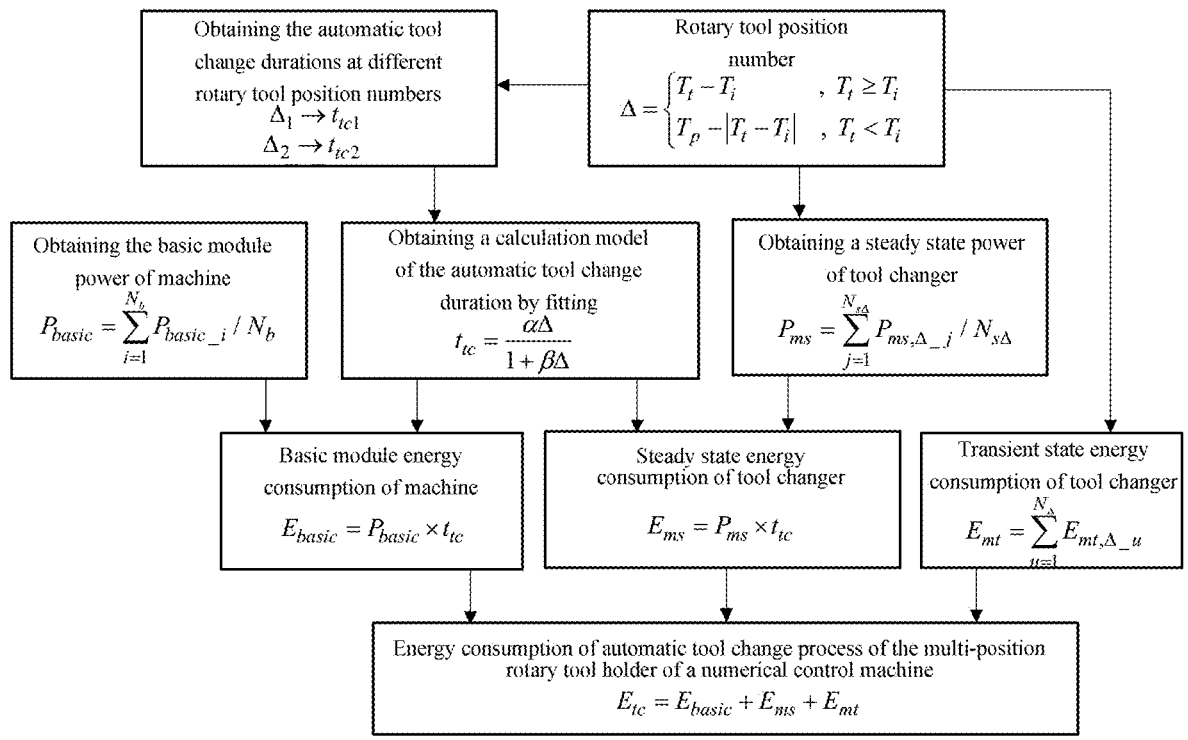
FIG. 1 is a flowchart illustrating a method of the present disclosure.

The present disclosure provides a method of accurately predicting energy consumption of an automatic tool change process of a multi-position rotary tool holder of a numerical control machine. FIG. 1 illustrates a flowchart of a method according to some examples of the present disclosure. Firstly, a rotary tool position number is obtained by calculating a current tool position number and a target tool position number of a rotary tool holder, automatic tool change durations at several groups of rotary tool position numbers are measured, and a calculation model of the automatic tool change duration is obtained by fitting. A basic module power of machine is obtained by collection and calculation. A basic module energy consumption of machine is obtained by calculation according to the obtained basic module power of machine and the obtained automatic tool change duration. A steady state power of tool changer is obtained by collection and calculation and a steady state energy consumption of tool changer is obtained by calculation according to the obtained the steady state power of tool changer and the obtained automatic tool change duration. A transient state energy consumption of tool changer is obtained by accumulating energy consumptions caused by all power peaks in the automatic tool change process of the numerical control machine. An energy consumption prediction model of the automatic tool change process is obtained based on the obtained basic module energy consumption of machine, the obtained steady state energy consumption of tool changer, and the obtained transient state energy consumption of tool changer, thereby accurately predicting energy consumption of the automatic tool change process of the numerical control machine and providing basic model support to the energy-saving optimization of the machine.

In the examples of the present disclosure, an automatic tool change process of a numerical control machine CK6153i is taken as an example, a rotary tool holder used by the numerical control machine is a four-position rotary tool holder and a rotation manner is a unidirectional sequential rotation. The energy consumptions of automatic tool change at different rotary tool position numbers are predicted accurately in advance by establishing an energy consumption prediction model of the automatic tool change process according to the method of the present disclosure.

1. The rotary tool position number is determined.

The rotary tool position number is determined according to a current tool position number and a target tool position number of the multi-position rotary tool holder of the numerical control machine. The numerical control machine CK6153i adopts the four-position rotary tool holder, therefore, the total tool position number of the rotary tool holder is $T_p=4$. The rotary tool position number is calculated based on the following formula:

$$\Delta = \begin{cases} T_t - T_i, & T_t \geq T_i \\ T_p - |T_t - T_i|, & T_t < T_i \end{cases}.$$

In the formula, $\Delta$ refers to the rotary tool position number of the rotary tool holder, $T_t$ refers to the target tool position number of the rotary tool holder, $T_i$ refers to the current tool position number of the rotary tool holder, $T_p$ refers to the total tool position number of the rotary tool holder. It is assumed that the current tool position number $T_i=1$ and the target tool position number $T_t=4$ and $T_t \geq T_i$ is satisfied. Thus, the rotary tool position number is $\Delta=T_t-T_i=4-1=3$. It is assumed that current tool position number $T_i=4$, the target tool position number $T_t=2$ and $T_t<T_i$ is satisfied. Thus, the rotary tool position number is $\Delta=T_p-|T_t-T_i|=4-|2-4|=2$. A rotary tool position number at any current tool position number and any target tool position number may be obtained by the above method.

2. The automatic tool change durations at a plurality of different rotary tool position numbers are obtained.

When the rotary tool position numbers are $\Delta=0$, $\Delta=1$, $\Delta=2$ and $\Delta=3$, the automatic tool change durations $t_{tc}$ are measured with a stopwatch respectively. The obtained automatic tool change durations at different rotary tool position numbers are indicated as in Table 1.

TABLE 1

| SN | Rotary tool position number | Automatic tool change duration (s) |
|---|---|---|
| 1 | $\Delta_1 = 0$ | $t_{tc1} = 0$ |
| 2 | $\Delta_2 = 1$ | $t_{tc2} = 3.0$ |
| 3 | $\Delta_3 = 2$ | $t_{tc3} = 3.5$ |
| 4 | $\Delta_4 = 3$ | $t_{tc4} = 4.1$ |

3. The calculation model of automatic tool change duration is established by fitting.

The above obtained automatic tool change durations at a plurality of groups of rotary tool position numbers satisfy the following formula:

$$\begin{cases} t_{tc1} = \dfrac{\alpha \Delta_1}{1 + \beta \Delta_1} \\ t_{tc2} = \dfrac{\alpha \Delta_2}{1 + \beta \Delta_2} \\ \quad \ldots \\ t_{tc4} = \dfrac{\alpha \Delta_4}{1 + \beta \Delta_4} \end{cases}$$

Figure 2:
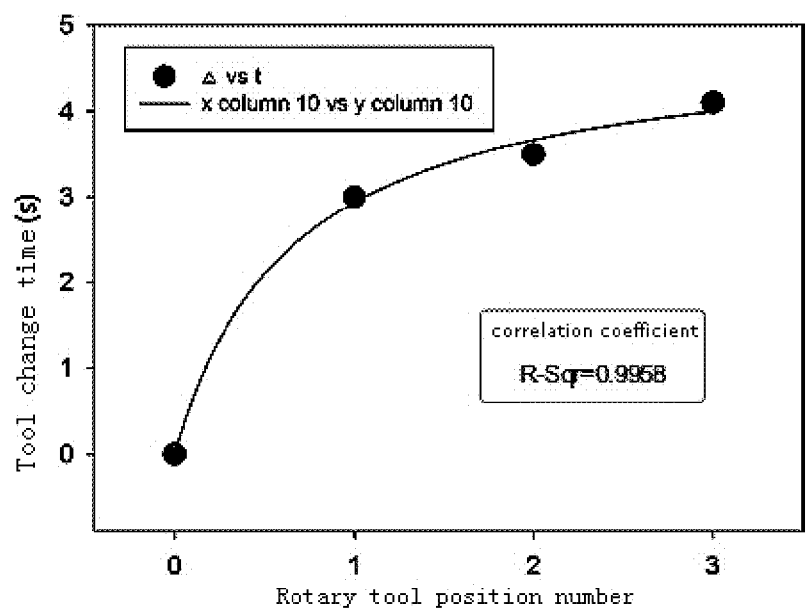
FIG. 2 is a fitting diagram for an automatic tool change duration.

Data fitting is performed by Sigmaplot 13 software with the rotary tool position number $\Delta$ as an independent variable and the automatic tool change duration $t_{tc}$ as a response variable. The coefficients $\alpha=7.3766$ and $\beta=1.5127$ may be obtained. As shown in FIG. 2, a fitting result shows that a correlation coefficient R-sqr is 0.9958 which is very approximate to 1, which indicates that the fitting formula can represent the automatic tool change duration values at different rotary tool position numbers in a better way. The automatic tool change duration of the numerical control machine CK6153i can be obtained by taking three places after the decimal point of the coefficient value based on the formula:

$$t_{tc} = \frac{7.377\Delta}{1+1.513\Delta}.$$

In the formula, $t_{tc}$ is the automatic tool change duration in the unit of second (s) and $\Delta$ is the rotary tool position number.

4. Basic module power of machine is obtained.

Figure 3:
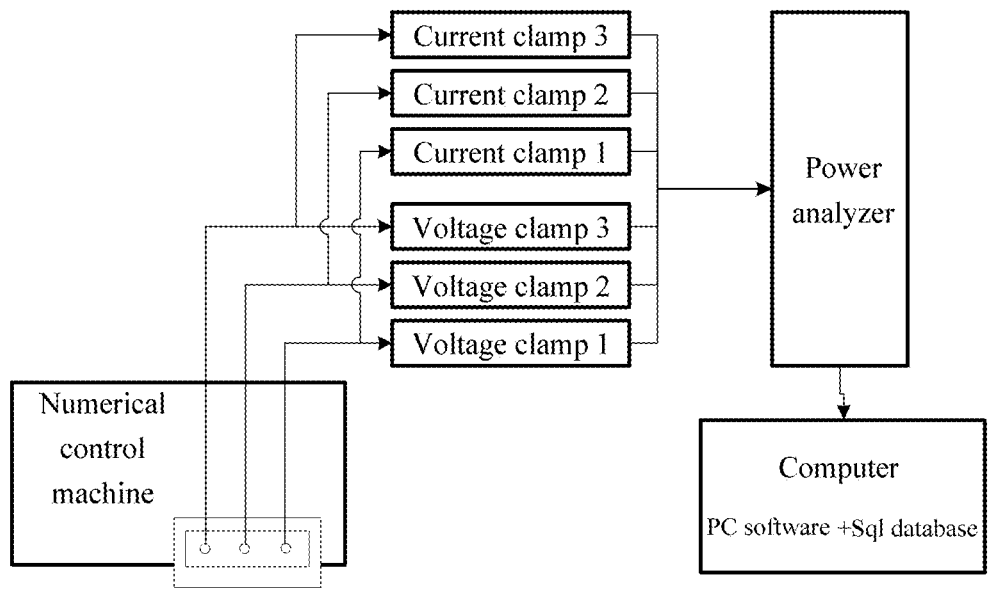
FIG. 3 is a schematic diagram illustrating a power-energy consumption collecting apparatus according to some examples of the present disclosure.

The basic module power of machine $P_{basic}$ is obtained by collecting a plurality of basic module powers of machine and obtaining an average value. The power-energy consumption collecting apparatus for collecting powers is as shown in FIG. 3. Three voltage clamps are connected with three phase lines at an output end of an air switch of the numerical control machine respectively to measure a three-phase voltage signal of the automatic tool change process of the numerical control machine. Three current clamps are sleeved on the three phase lines at the output end of the air switch respectively to measure a three-phase current signal of the automatic tool change process of the numerical control machine. Information of the power and the energy consumption of the automatic tool change process of the numerical control machine is obtained by transmitting the voltage and current signals to a power analyzer for analysis and stored in an SQL database in a computer. The apparatus is connected with the numerical control machine CK6153i. The numerical control machine CK6153i is started to only allow the basic module of machine to be in a running state without performing any other operations and 50 groups of basic module power values of machine are measured as shown in Table 2.

TABLE 2

| SN | Basic module power of machine | Power measured value (W) |
|---|---|---|
| 1 | $P_{basic\_1}$ | 335.6 |
| 2 | $P_{basic\_2}$ | 331.9 |
| 3 | $P_{basic\_3}$ | 333.7 |
| ... | ... | ... |
| 49 | $P_{basic\_49}$ | 331.5 |
| 50 | $P_{basic\_50}$ | 332.2 |

The basic module power of machine is calculated based on the formula:

$$P_{basic} = \sum_{i=1}^{N_b} P_{basic\_i} / N_b,$$

where $P_{basic}$ refers to the basic module power of machine in the unit of Watt(W); $P_{basic\_i}$ refers to the i-th basic module power value of machine collected in the unit of W; $N_b$ refers to a total number of basic module powers of machine collected. Since 50 groups of basic module power values of machine are collected in total as above, $N_b$=50. The basic module power of machine of the numerical control machine CK6153i is obtained by substituting the 50 groups of data collected above into the formula $$P_{basic} = \sum_{i=1}^{50} P_{basic\_i} / 50 = 332.1 \ (W).$$

5. The basic module energy consumption of machine is calculated.

The basic module energy consumption of machine in the automatic tool change process of the numerical control machine is obtained by performing calculation based on the obtained basic module power of machine and the obtained automatic tool change duration, where the calculation formula is $E_{basic}=P_{basic} \times t_{tc}$. In the formula, $E_{basic}$ refers to the basic module energy consumption of machine in the automatic tool change process of the numerical control machine in the unit of Joule (J); $P_{basic}$ refers to the basic module power of machine in the unit of W; $t_{tc}$ refers to the automatic tool change duration in the unit of s. For the numerical control machine CK6153i, the basic module power of machine is obtained as $P_{basic}$=332.1 (W) and the automatic tool change duration is obtained as $$t_{tc} = \frac{7.377 \times 1}{1+1.513 \times 1} = 2.9 \ (s).$$

Further, the basic module energy consumption of machine in the automatic tool change process of the numerical control machine is obtained as $E_{basic}$=332.1×2.9=963.1 (J).

6. The steady state power of tool changer is obtained.

Figure 4:
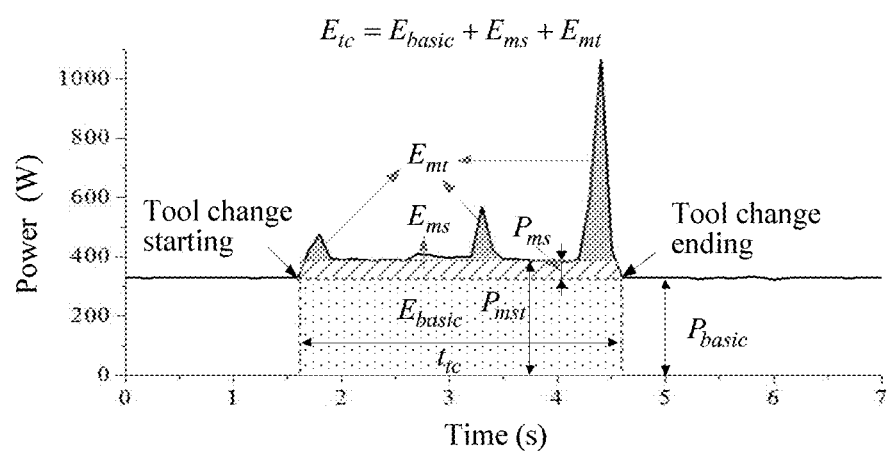
FIG. 4 is a diagram illustrating a power curve of an automatic tool process of a numerical control machine.

The steady state power of tool changer in the automatic tool change process of the numerical control machine is obtained by collecting a plurality of steady state powers of tool changer and obtaining an average value. As shown in FIG. 4, the steady state power of tool changer is collected as follows: when the rotary tool position number is $\Delta$, the steady state power of machine $P_{mst}$ in the automatic tool change process is collected, the steady state power value of tool changer $P_{ms}$ is obtained by subtracting the basic module power of machine $P_{basic}$ from the collected steady state power of machine $P_{mst}$ in the automatic tool change process. For example, for the numerical control machine CK6153i, when the rotary tool position number is $\Delta$=1, the first steady state power value of machine $P_{mst,1\_1}$=395.6 (W) in the automatic tool change process is collected and the basic module power of machine $P_{basic}$=332.1 (W) of the numerical control machine CK6153i is obtained. Thus, the first measured value of the steady state power of tool changer when the rotary tool position number is $\Delta$=1 may be obtained as $P_{ms,1\_1}=P_{mst,1\_1}-P_{basic}$=395.6−332.1=63.5 (W). By the same method, 20 groups of steady state power values of tool changer when the rotary tool position number is $\Delta$=1 are collected as shown in Table 3.

TABLE 3

| SN | Steady state power of tool changer | Power measured value (W) |
|---|---|---|
| 1 | $P_{ms,1\_1}$ | 63.5 |
| 2 | $P_{ms,1\_2}$ | 63.6 |
| 3 | $P_{ms,1\_3}$ | 62.9 |
| ... | ... | ... |
| 19 | $P_{ms,1\_19}$ | 62.0 |
| 20 | $P_{ms,1\_20}$ | 63.3 |

The steady state power of tool changer is calculated based on the formula:

$$P_{ms} = \sum_{j=1}^{N_{s\Delta}} P_{ms,\Delta\_j} / N_{s\Delta},$$

where $P_{ms}$ refers to the steady state power of tool changer in the unit of W; $P_{ms,\Delta\_j}$ refers to the j-th measured value of steady state power of tool changer in the unit of W when the rotary tool position number of the rotary tool holder is $\Delta$; $N_{s\Delta}$ refers to the total number of the measured values of steady state power of tool changer when the rotary tool position number of the rotary tool holder is $\Delta$. As above, 20 groups of steady state power values of tool changer when the rotary tool position number is $\Delta=1$ are collected in total. Therefore, $N_{s1}=20$ and the steady state power of tool changer in the automatic tool change process of the numerical control machine CK6153i when the rotary tool position number is $\Delta=1$ is calculated by substituting the above 20 groups of data into the formula $$P_{ms} = \sum_{j=1}^{20} P_{ms,1\_j}/20 = 63.1 \text{ (W)}.$$

For the numerical control machine CK6153i, by the same method, the steady state power of tool changer when the rotary tool position number is $\Delta=2$ may be obtained as 66.5 W and the steady state power of tool changer when the rotary tool position number $\Delta=3$ may be obtained as 62.8 W.

7. The steady state energy consumption of tool changer is calculated.

The steady state energy consumption of tool changer in the automatic tool change process of the numerical control machine is obtained by calculation according to the obtained steady state power of tool changer and the obtained automatic tool change duration, where the calculation formula is $E_{ms}=P_{ms} \times t_{tc}$. In the formula, $E_{ms}$ refers to the steady state energy consumption of tool changer in the automatic tool change process of the numerical control machine in the unit of J; $P_{ms}$ refers to the steady state power of tool changer in the unit of W; $t_{tc}$ refers to the automatic tool change duration in the unit of S. For the numerical control machine CK6153i, when the rotary tool position number is $\Delta=1$, the steady state power of tool changer is obtained as $P_{ms}=63.1$ (W) and the automatic tool change duration is obtained as $t_{tc}$2.9 (S). Further, the steady state energy consumption of tool changer of the automatic tool change process of the numerical control machine CK6153i when the rotary tool position number $\Delta=1$ is obtained as $E_{ms}=63.1\times2.9=183.0$ (J).

8. The transient state energy consumption of tool changer is calculated.

A plurality of power peaks will be generated in the automatic tool change process of the numerical control machine and a sum of all energy consumptions caused by all power peaks is calculated as the transient state energy consumption of tool changer according to the formula:

$$E_{mt} = \sum_{u=1}^{N_\Delta} E_{mt,\Delta\_u}.$$

Figure 5:
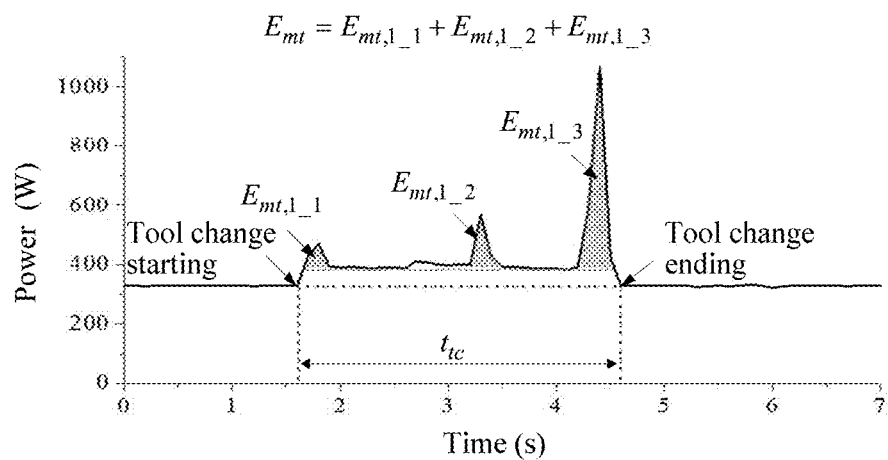
FIG. 5 is a schematic diagram illustrating composition of a transient state energy consumption of tool changer.

In the formula, $E_{mt}$ refers to the transient state energy consumption of tool changer in the automatic tool change process of the numerical control machine in the unit of J; $\Delta$ refers to the rotary tool position number of the rotary tool holder; $E_{mt,\Delta\_u}$ refers to the energy consumption (in the unit of J) caused by the u-th power peak when the rotary tool position number of the rotary tool holder is $\Delta$; $N_\Delta$ refers to the total number of power peaks when the rotary tool position number of the rotary tool holder is $\Delta$. For the numerical control machine CK6153i, when the rotary tool position number is $\Delta=1$, the power curve of the automatic tool change process is as shown in FIG. 5. There are three power peaks in the automatic tool change process. Therefore, $N_1=3$ and at this time, the transient state energy consumption value of tool changer is a sum of energy consumptions caused by the three power peaks. The energy consumptions caused by the three power peaks when the rotary tool position number is $\Delta=1$ are obtained as $E_{mt,1\_1}=4.6$ (J), $E_{mt,1\_2}=23.9$ (J), and $E_{mt,1\_2}=88.3$ (J) respectively according to energy consumption collection data. The transient state energy consumption of tool changer when the rotary tool position number of the numerical control machine CK6153i is 1 is calculated as $$E_{mt} = \sum_{u=1}^{3} E_{mt,1\_u} = 4.6 + 23.9 + 88.3 = 116.8 \text{ (J)}$$

based on the formula $$E_{mt} = \sum_{u=1}^{N_\Delta} E_{mt,\Delta\_u}.$$

9. The energy consumption of the automatic tool change process is calculated.

As shown in FIG. 4, the energy consumption of the automatic tool change process of the numerical control machine includes the basic module energy consumption of machine, the steady state energy consumption of tool changer and the transient state energy consumption of tool changer in the process. Therefore, the energy consumption of the automatic tool change process may be calculated according to the obtained basic module energy consumption of machine, the obtained steady state energy consumption of tool changer and the obtained transient state energy consumption of tool changer in the automatic tool change process of the numerical control machine, where the calculation formula is $E_{tc}=E_{basic}+E_{ms}+E_{mt}$. In the formula, $E_{tc}$ refers to the energy consumption of the automatic tool change process of the multi-position rotary tool holder of the numerical control machine in the unit of J; $E_{basic}$ refers to the basic module energy consumption of machine in the automatic tool change process of the numerical control machine in unit of J; $E_{ms}$ refers to the steady state energy consumption of tool changer in the automatic tool change process of the numerical control machine in the unit of J; $E_{mt}$ refers to the transient state energy consumption of tool changer in the automatic tool change process of the numerical control machine in the unit of J. when the rotary tool position number of the numerical control machine CK6153i is $\Delta=1$, the basic module energy consumption of machine is $E_{basic}=963.1$ (J); the steady state energy consumption of tool changer is $E_{ms}=183.0$ (J); the transient state energy consumption of tool changer is $E_{mt}=116.8$ (J). Therefore, the energy consumption of the automatic tool change process of the numerical control machine is calculated as $E_{tc}=963.1+183.0+116.8=1262.9$ (J). By the same method, the energy consumption prediction values of the automatic tool change process when the rotary tool position number of the numerical control machine CK6153i is $\Delta=2$ and $\Delta=3$ respectively are obtained as shown in Table 4. At the same time, the measured values of energy consumptions of the automatic tool change process when the rotary tool position number of the numerical control machine CK6153i is 1, 2 and 3 respectively are collected by the power-energy consumption collecting apparatus shown in FIG. 3 and the effectiveness of the present disclosure is verified by the accuracy calculation formula: Accuracy=(1−|Etc prediction−Etc measurement|/Etc measurement)×100%, with accuracy results shown in Table 4.

TABLE 4

| Item | Rotary tool position number (Δ = 1) | Rotary tool position number (Δ = 2) | Rotary tool position number (Δ = 3) |
|---|---|---|---|
| $E_{basic}$ (J) | 963.1 | 1228.8 | 1328.4 |
| $E_{ms}$ (J) | 183.0 | 246.1 | 251.2 |
| $E_{mt}$ (J) | 116.8 | 109.7 | 137.4 |
| $E_{tc\ prediction}$ (J) | 1262.9 | 1584.6 | 1717.0 |
| $E_{tc\ measure}$ (J) | 1306.8 | 1516.6 | 1740.4 |
| Accuracy (%) | 96.64 | 95.52 | 98.66 |

Through the above comparison results, it is found that the accuracy of predicting the energy consumption of the automatic tool change process of the multi-position rotary tool holder of the numerical control machine by the method of the present disclosure is above 95%, which indicates that the method of the present disclosure can accurately predict the energy consumption of the automatic tool change process of the multi-position rotary tool holder of the numerical control machine.

The method of the present disclosure may be applied to prior accurate prediction of energy consumption of the automatic tool change process of the multi-position rotary tool holder of the numerical control machine and the calculation result may be applied to energy prediction of the entire machining process of the numerical control machine. In this way, the prediction accuracy is improved and a support is provided for energy optimization of the numerical control machine.

Finally, it is noted that the above examples are merely used for describing the technical solutions of the present disclosure rather than limiting the present disclosure. Any modification or equivalent substitutions made to the technical solutions of the present disclosure without departing from the tenet and scope of the present disclosure shall all fall in the scope of protection of the claims of the present disclosure.

The invention claimed is:

1. A method of accurately predicting energy consumption of an automatic tool change process of a multi-position rotary tool holder of a numerical control machine, comprising:

at step 1, determining a rotary tool position number according to a current tool position number and a target tool position number of the multi-position rotary tool holder of the numerical control machine, wherein the multi-position rotary tool holder of the numerical control machine adopts a unidirectional sequential rotation manner and therefore the rotary tool position number is calculated according to a formula expressed by:

$$\Delta = \begin{cases} T_t - T_i, & T_t \geq T_i \\ T_p - |T_t - T_i|, & T_t < T_i \end{cases}$$

in the formula, Δ refers to the rotary tool position number of the rotary tool holder, $T_t$ refers to the target tool position number of the rotary tool holder, $T_i$ refers to the current tool position number of the rotary tool holder and $T_p$ refers to the total tool position number of the rotary tool holder;

at step 2, measuring automatic tool change duration values $t_{tc1}, t_{tc2}, \ldots t_{tcN}$ at different rotary tool position numbers $\Delta_1, \Delta_2, \ldots \Delta_N$ of the numerical control machine, wherein, $\Delta_1$ refers to a 1-st rotary tool position number, $\Delta_2$ refers to a 2-nd rotary tool position number, $\Delta_N$ refers to an N-th rotary tool position number, $t_{tc1}$ refers to the automatic tool change duration value at the 1-st rotary tool position number, $t_{tc2}$ refers to the automatic tool change duration value at the 2-nd rotary tool position number, $t_{tcN}$ refers to the automatic tool change duration value at the N-th rotary tool position number;

at step 3, performing data fitting with the rotary tool position number Δ as an independent variable and the automatic tool change duration values $t_{tc}$ as a response variable according to the obtained automatic tool change duration values at a plurality of groups of different rotary tool position numbers and establishing a calculation model formula of the automatic tool change duration values with the calculation model formula expressed as:

$$t_{tc} = \frac{\alpha \Delta}{1 + \beta \Delta}$$

wherein $t_{tc}$ refers to the automatic tool change duration, Δ refers to the rotary tool position number of the rotary tool holder and α and β refer to coefficients of the calculation model formula;

at step 4, obtaining a basic module power of machine by collecting a plurality of basic module powers of machine and obtaining an average value, wherein a power calculation formula is expressed as:

$$P_{basic} = \sum_{i=1}^{N_b} P_{basic\_i} / N_b$$

wherein $P_{basic}$ refers to basic module power of machine, $P_{basic\_i}$ refers to an i-th measured value of the basic module power of machine, and $N_b$ refers to a total number of the measured values of the basic module power of machine;

at step 5, a basic module energy consumption of machine in the automatic tool change process of the numerical control machine is calculated according to the obtained basic module power of machine and the obtained automatic tool change duration, wherein a calculation formula is expressed as:

$$E_{basic} = P_{basic} \times t_{tc}$$

wherein $E_{basic}$ refers to the basic module energy consumption of machine in automatic tool change process of the numerical control machine, $P_{basic}$ refers to the basic module power of machine and $t_{tc}$ refers to the automatic tool change duration;

at step 6, obtaining a steady state power of tool changer in the automatic tool change process of the numerical control machine by collecting a plurality of steady state powers of tool changer and obtaining an average value, wherein a calculation formula is expressed as:

$$P_{ms} = \sum_{j=1}^{N_{s\Delta}} P_{ms,\Delta\_j} / N_{s\Delta}$$

wherein $P_{ms}$ refers to the steady state power of tool changer, $P_{ms,\Delta\_j}$ refers to a j-th measured value of the steady state power of tool changer when the rotary tool position number of the rotary tool holder is $\Delta$ and $N_{s\Delta}$ refers to a total number of the measured values of the steady state powers of tool changer when the rotary tool position number of the rotary tool holder is $\Delta$;

at step 7, obtaining a steady state energy consumption of tool changer in the automatic tool change process of the numerical control machine according to the obtained steady state power of tool changer and the obtained automatic tool change duration, wherein a calculation formula is expressed as:

$$E_{ms} = P_{ms} \times t_{tc}$$

wherein $E_{ms}$ refers to the steady state energy consumption of tool changer in the automatic tool change process of the numerical control machine, $P_{ms}$ refers to the steady state power of tool changer, and $t_{tc}$ refers to the automatic tool change duration values;

at step 8, obtaining a transient state energy consumption of tool changer by accumulating energy consumptions caused by all power peaks in the automatic tool change process of the numerical control machine, wherein a calculation formula is expressed as:

$$E_{mt} = \sum_{u=1}^{N_\Delta} E_{mt,\Delta\_u}$$

wherein $E_{mt}$ refers to the transient state energy consumption of tool changer in the automatic tool change process of the numerical control machine, A refers to the rotary tool position number of the rotary tool holder, $E_{mt,\Delta\_u}$ refers to the energy consumption caused by a u-th power peak when the rotary tool position number of the rotary tool holder is $\Delta$ and $N_\Delta$ refers to a total number of the power peaks when the rotary tool position number of the rotary tool holder is $\Delta$;

at step 9, calculating the energy consumption of the automatic tool change process according to the obtained basic module energy consumption of machine, the obtained steady state energy consumption of tool changer, and the obtained transient state energy consumption of tool changer in the automatic tool change process of the numerical control machine, wherein a calculation formula is expressed as:

$$E_{tc} = E_{basic} + E_{ms} + E_{mt}$$

wherein $E_{tc}$ refers to energy consumption of the automatic tool change process of the multi-position rotary tool holder of the numerical control machine, $E_{basic}$ refers to the basic module energy consumption of machine in the automatic tool change process of the numerical control machine, $E_{ms}$ refers to the steady state energy consumption of tool changer in the automatic tool change process of the numerical control machine and $E_{mt}$ refers to the transient state energy consumption of tool changer in the automatic tool change process of the numerical control machine.

2. The method of accurately predicting energy consumption of the automatic tool change process of the multi-position rotary tool holder of the numerical control machine according to claim 1, wherein at step 6, the j-th measured value of the steady state power of tool changer when the rotary tool position number of the rotary tool holder is $\Delta$ is collected as follows: collecting the j-th steady state power of machine $P_{mst,\Delta\_j}$ in the automatic tool change process when rotary tool position number is $\Delta$, and obtaining a rotational power of a main shaft at the rotation speed by further subtracting the basic module power of machine $P_{basic}$, where the rotational power is expressed as $P_{ms,\Delta\_j} = P_{mst,\Delta\_j} - P_{basic}$.

* * * * *